US006792592B2

(12) United States Patent
Keogan et al.

(10) Patent No.: US 6,792,592 B2
(45) Date of Patent: Sep. 14, 2004

(54) CONSIDERING MASK WRITER PROPERTIES DURING THE OPTICAL PROXIMITY CORRECTION PROCESS

(75) Inventors: Danny Keogan, Palo Alto, CA (US); Christophe Pierrat, Santa Clara, CA (US)

(73) Assignee: Numerical Technologies, Inc., San Jose, CA (US)

(*) Notice: Subject to any disclaimer, the term of this patent is extended or adjusted under 35 U.S.C. 154(b) by 55 days.

(21) Appl. No.: 10/232,130

(22) Filed: Aug. 30, 2002

(65) Prior Publication Data

US 2004/0044984 A1 Mar. 4, 2004

(51) Int. Cl.[7] .............................................. G06F 17/50
(52) U.S. Cl. ........................................ 716/19; 716/21
(58) Field of Search ....................... 716/19–21; 430/5, 430/30

(56) References Cited

U.S. PATENT DOCUMENTS

| | | | |
|---|---|---|---|
| 4,426,584 A | 1/1984 | Bohlen et al. ............ 250/492.2 |
| 4,520,269 A | 5/1985 | Jones ....................... 250/492.2 |
| 5,051,598 A | 9/1991 | Ashton et al. ............ 250/492.2 |
| 5,241,185 A | 8/1993 | Meiri et al. .............. 250/492.2 |
| 5,432,714 A | 7/1995 | Chung et al. ................ 364/525 |
| 5,631,110 A | 5/1997 | Shioiri et al. ................... 430/5 |
| 5,682,323 A | 10/1997 | Pasch et al. ................. 364/491 |
| 5,723,233 A | 3/1998 | Garza et al. .................... 430/5 |
| 5,815,685 A | 9/1998 | Kamon ....................... 395/500 |
| 5,825,647 A | 10/1998 | Tsudaka ................. 364/167.03 |
| 5,847,959 A | 12/1998 | Veneklasen et al. ... 364/468.28 |
| 5,863,682 A | 1/1999 | Abe et al. ..................... 430/30 |
| 5,879,844 A * | 3/1999 | Yamamoto et al. ........... 430/30 |
| 5,991,006 A | 11/1999 | Tsudaka ....................... 355/53 |
| 6,014,456 A | 1/2000 | Tsudaka ..................... 382/144 |
| 6,081,658 A | 6/2000 | Rieger et al. ........... 395/500.22 |
| 6,154,563 A | 11/2000 | Tsudaka ..................... 382/144 |
| 6,185,727 B1 * | 2/2001 | Liebmann ..................... 716/19 |
| 6,243,855 B1 | 6/2001 | Kobayashi et al. ........... 716/19 |

(List continued on next page.)

FOREIGN PATENT DOCUMENTS

| | | |
|---|---|---|
| GB | 2324169 A | 10/1998 |
| JP | 3-80525 | 4/1991 |
| WO | WO 00/36525 A2 | 6/2000 |
| WO | WO 00/67074 A1 | 11/2000 |
| WO | WO 02/29491 A1 | 4/2002 |

OTHER PUBLICATIONS

Ackmann. P., et al., "Phase shifting and Optical Proximity Corrections to Imporve CD Control on Logic Devices in Manufacturing for Sub 0.35 um I–Line", SPIE, vol. 3051, pp. 146–153, Mar. 12–14. 1997.

(List continued on next page.)

Primary Examiner—Matthew Smith
Assistant Examiner—Pau Dinh
(74) Attorney, Agent, or Firm—Park, Vaughan & Fleming LLP (57) ABSTRACT

One embodiment of the invention provides a system that performs optical proximity correction in a manner that accounts for properties of a mask writer that generates a mask used in printing an integrated circuit. During operation, the system receives an input layout for the integrated circuit. The system also receives a set of mask writer properties that specify how the mask writer prints features. Next, the system performs an optical proximity correction process on the input layout to produce an output layout that includes a set of optical proximity corrections. This optical proximity correction process accounts for the set of mask writer properties in generating the set of optical proximity corrections, so that the mask writer can accurately produce the set of optical proximity corrections.

20 Claims, 11 Drawing Sheets

U.S. PATENT DOCUMENTS

| | | | |
|---|---|---|---|
| 6,249,597 B1 | 6/2001 | Tsudaka | 382/144 |
| 6,289,499 B1 | 9/2001 | Rieger et al. | 716/21 |
| 6,298,473 B1 | 10/2001 | Ono et al. | 716/21 |
| 6,370,441 B1 * | 4/2002 | Ohnuma | 716/21 |
| 6,415,421 B2 * | 7/2002 | Anderson et al. | 716/4 |
| 6,453,457 B1 | 9/2002 | Pierrat et al. | 716/19 |
| 6,578,188 B1 * | 6/2003 | Pang et al. | 716/19 |
| 6,579,651 B2 * | 6/2003 | Subramanian et al. | 430/5 |
| 6,605,481 B1 * | 8/2003 | Wu et al. | 438/14 |
| 6,634,018 B2 * | 10/2003 | Randall et al. | 716/19 |
| 2002/0010904 A1 | 1/2002 | Ayres | 716/19 |
| 2002/0100004 A1 | 7/2002 | Pierrat et al. | 716/5 |

OTHER PUBLICATIONS

Lithas. "Lithas: Opitcal Proximity Correction Software" (2 pages).

Precim. "Proxima System", Precim Company, Portland, Oregon (2 pages).

Prccim, "Proxima Wafer Porximity Correction System", Prccim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography". Motorola Inc. IDT assignee to IMEC (12 pages).

Stirniman. J., et al., "Quantifying Porximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Slaeh, B., et al., "Reduction of Errors of Microphotographic Reproductions by Optimal Corrections of Original Masks", Optical Engineering, vol. 20. No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K., et al., "A Novel Hierarchical Approach for Proximity Effect Correction in Electron Beam Lithography", IEEE. vol. 12, No. 10, pp. 1508–1514, Oct. 1993.

Rieger, M., et al., "System for Lithography Proximity Compensation", Precim Company, Portland. Oregon. Sep. 1993 (28 pages).

Pierrat, C., et al., "A Rule–Based Approach to E–Beam and Process–Induced Proximity Effect Correction for Phase–Shifting Mask Fabrication", SPIE. vol. 2194, pp. 298–309 (1994).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE., Photomask Technology And Management. vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R., et al., "Optical Proximity Effect Correction: An Emerging Technology", Microlithography World, pp. 6–12, (1994).

Barouch, E., et al., "OPTIMASK: An OPC Algorithm for Chrome and Phase–Shift Mask Design", SPIE, Vo. 2440, pp. 192–206. Feb. 1995.

Cobb, N., et al., "Fast, Low–Complexity Mask Design", SPIE, vol. 2440, pp. 313–327, Feb. 22–24, 1995.

Yen. A., et al., "Characterization and Correction of Optical Proximity Effects in Deep–Ultraviolet Lithography Using Behavior Modeling", J. Vac. Sci. Technol. B. vol. 14, No. 6, pp. 4175–4178. Nov./Dec. 1996.

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Application of a Simple Resist Model to Fast Optical Proximity Correction", SPIE, vol. 3051, pp. 774–780 (1997).

Chuang, H., et al., "Practical Applications of 2–D Optical Proximity Corrections for Enhanced Performance of 0.25um Random Logic Devices", IEEE, pp. 18.7.1–18.7.4, Dec. 1997.

Cobb, N., et al., "Experimental Results on Optical Proximity Correction With Variable Threshold Resist Model", SPIE, vol. 3051, pp. 458–468, Mar. 12–14, 1997

Asai, N., et al., "Proposal for the Coma Aberration Dependent Overlay Error Compensation Technology", Jpn. J. Appl. Phys., vol. 37, pp. 6718–6722 (1998).

Cobb, N., et al.,"Fast Optical and Process Proximity Correction Algorithms for Integrated Circuit Manufacturing", Dissertation. University of California at Berkeley, UMI Microform 9902038 (139 pages).

Toublan, O., et al., "Phase Aware Proximity Correction for Advance Masks", SPIE, vol. 4000, pp. 160–170, Mar. 1–3, 2000.

Anonymous, "Parameterization For Full Shape And Rule Dependent Dissection", IPCOM000009587D, Sep. 4, 2002 (9 pages).

* cited by examiner

Added
"THROUGH A
PULL_DOWN MENU"

CONSIDERING MASK WRITER PROPERTIES DURING THE OPTICAL PROXIMITY CORRECTION PROCESS

BACKGROUND

1. Field of the Invention

The invention relates to the process of fabricating semiconductor chips. More specifically, the invention relates to a method and an apparatus that considers mask writer properties during an optical proximity correction (OPC) process, wherein the OPC process generates corrections for a layout of an integrated circuit so that the layout prints more accurately on a semiconductor chip.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture the integrated circuits. This optical lithography process begins with the formation of a photoresist layer on the surface of a semiconductor wafer. A mask composed of opaque regions, which are formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source, an ultraviolet light source, or more generally some other type of electromagnetic radiation, together with suitably adapted masks and lithography equipment.

This light is reduced and focused through an optical system that contains a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

Figure 1:
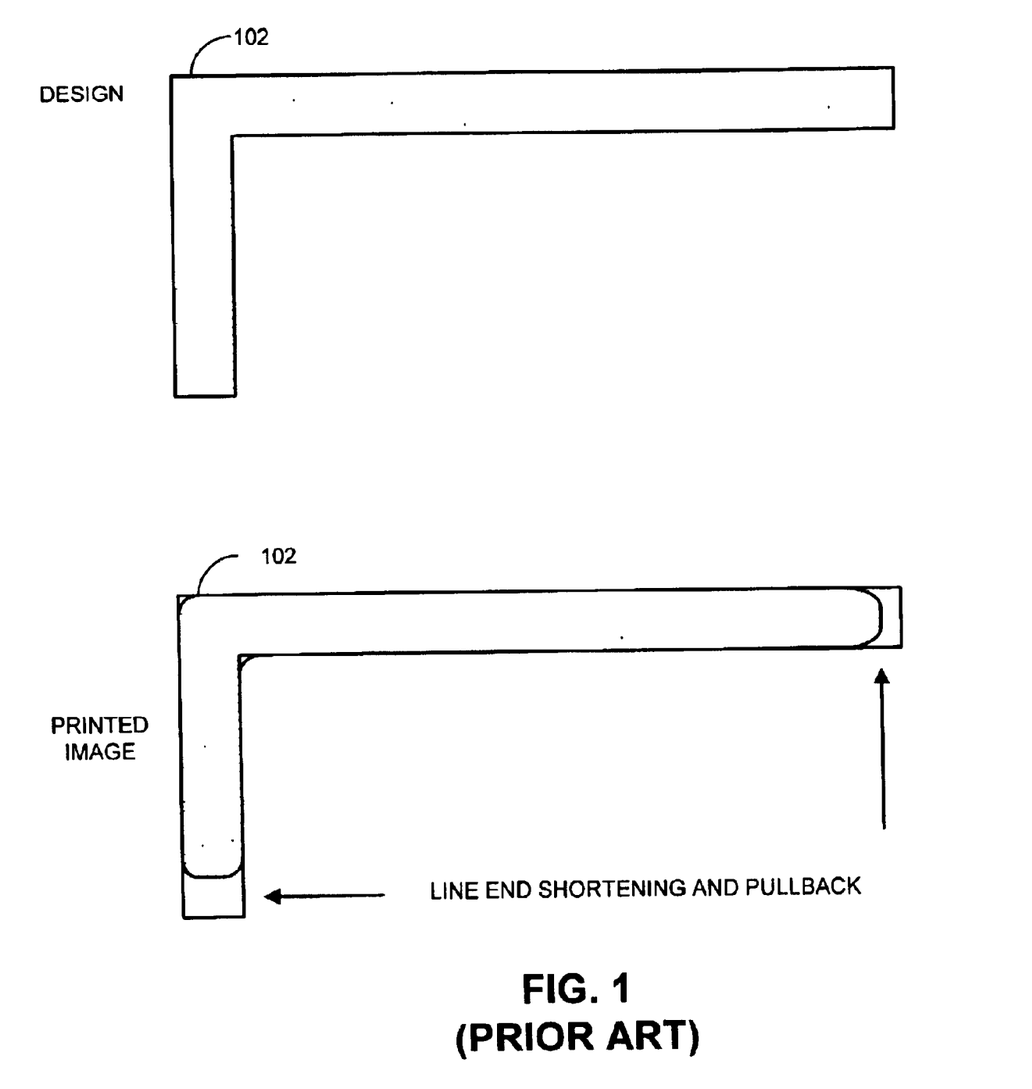
FIG. 1 illustrates the line end shortening problem.

One problem that arises during the optical lithography process is "line end shortening" and "pullback." For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates a printed image that results from the design.

Also note that because of optical effects and resist pullback there is a significant amount of line end shortening. This line end shortening is due to optical effects that cause the light to expose more of the resist under a line end than under other portions of the line.

Figure 2:
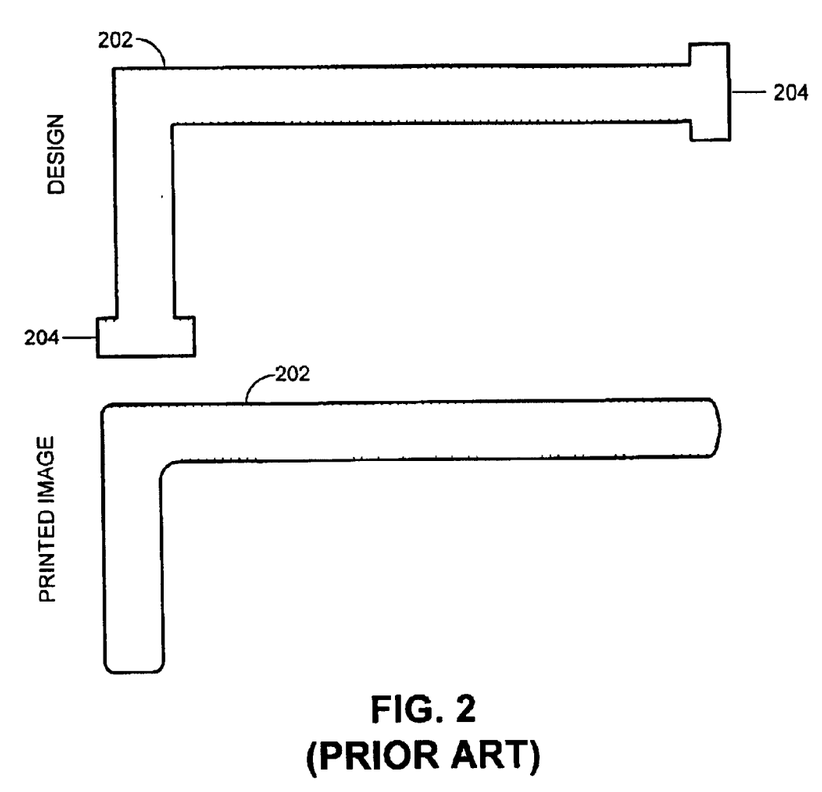
FIG. 2 illustrates the use of a hammerhead to compensate for the line end shortening problem.

In order to compensate for line end shortening, designers often add additional features, such as "hammer heads," onto line ends (see top portion of FIG. 2). The upper portion of FIG. 2 illustrates a transistor with a polysilicon line 202, running from left to right, which forms a gate region used to electrically couple an upper diffusion region with a lower diffusion region. A hammer head 204 is included on each end of polysilicon line 202 to compensate for the line end shortening. As is illustrated in the bottom portion of FIG. 2, these additional features can effectively compensate for line end shortening in some situations.

Figure 3A:
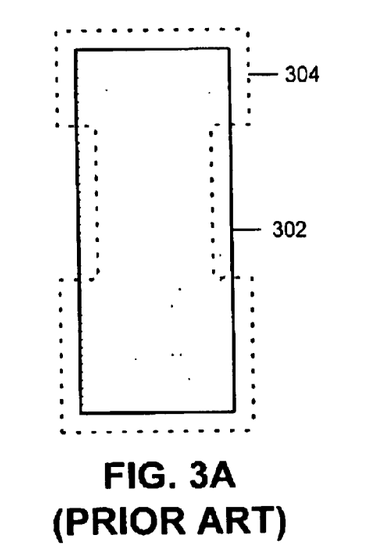
FIG. 3A illustrates a line end prior to and after optical proximity correction.

These additional features are typically added to a layout automatically during a process known as optical proximity correction (OPC). For example, FIG. 3 illustrates line end geometry 302 (solid line) prior to OPC and the resulting corrected line end geometry 304 after OPC (dashed line). Note that the corrected line end geometry 304 includes regions with a positive edge bias in which the size of the original geometry 302 is increased, as well as regions of negative edge bias in which the size of the original geometry 302 is decreased.

Unfortunately, current OPC techniques do not consider the fact that the output will later be used to generate a photomask. This can be a problem because mask-writing machines have limitations on the dimensions of shapes they can expose. During conversion of a layout to the mask-writer format, some of the shapes created by the OPC process have to be approximated. This approximation can degrade the quality of correction and may also increase the write time on the mask-writing machine.

Figure 3B:
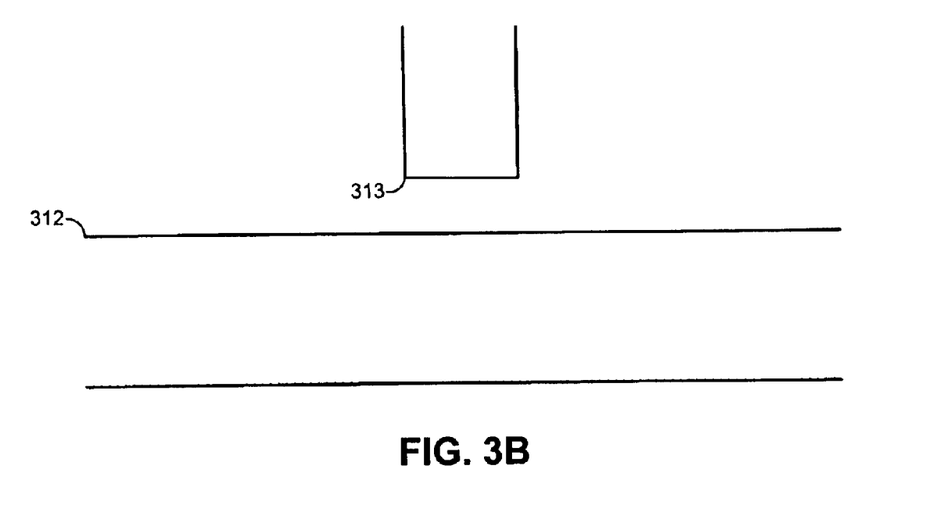
FIG. 3B illustrates a line in proximity to a neighboring line end.
Figure 3C:
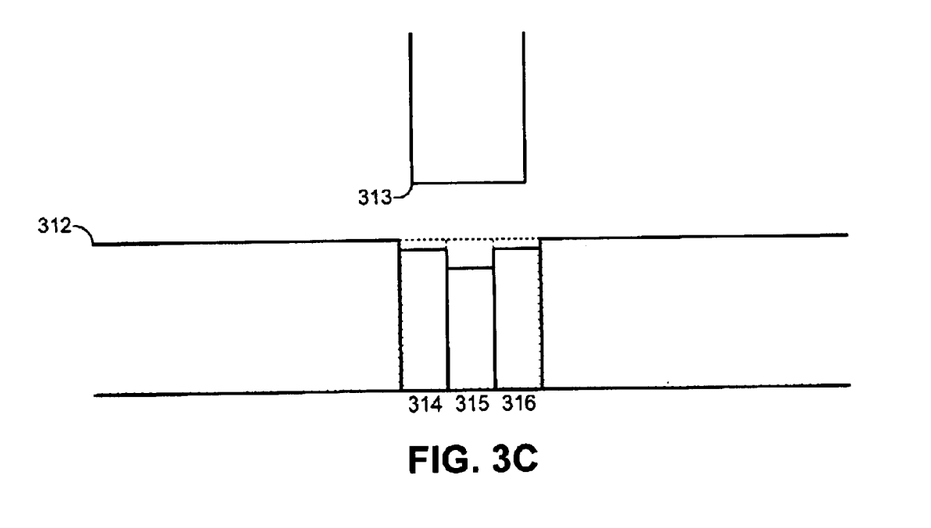
FIG. 3C illustrates an idealized set of optical proximity corrections.
Figure 3D:
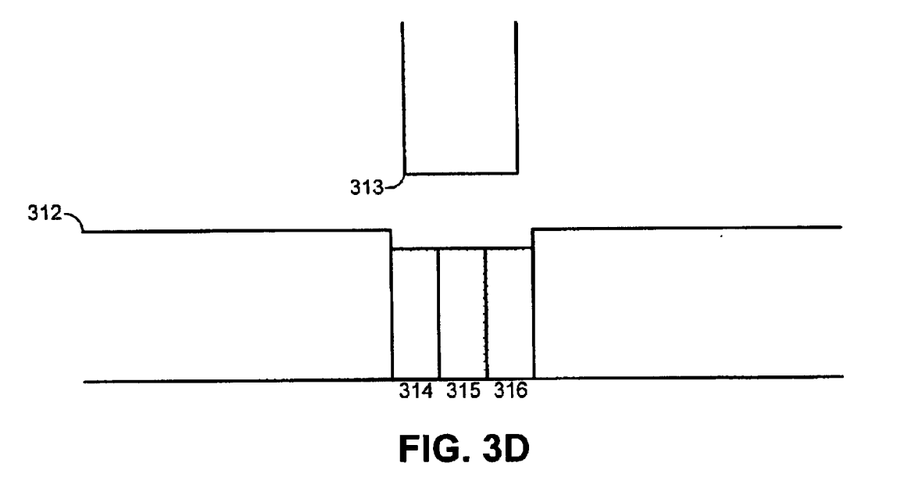
FIG. 3D illustrates resulting mask writer approximations.

In many cases, optical proximity corrections are produced on a finer grid than is used by the mask writer. Thus, the mask writer must approximate the optical proximity corrections on a larger grid. For example, referring to FIG. 3B, the system starts with a line 312 in the presence of a neighboring line end 313. Next, an OPC process performs corrections on line 312 to compensate for the presence of neighboring line end 313. In doing so, the OPC process first divides line 312 into a number of segments 314–316. Next, biases are applied to the segments 314–316 to compensate for the presence of line end 313. This results in a number of idealized correction features 314–316 as is illustrated in FIG. 3C. However, these idealized correction features 314–316 are defined on a grid that is finer than can be produced by the mask writer. Hence, the mask writer approximates the corrections as is illustrated in FIG. 3D.

Figure 3E:
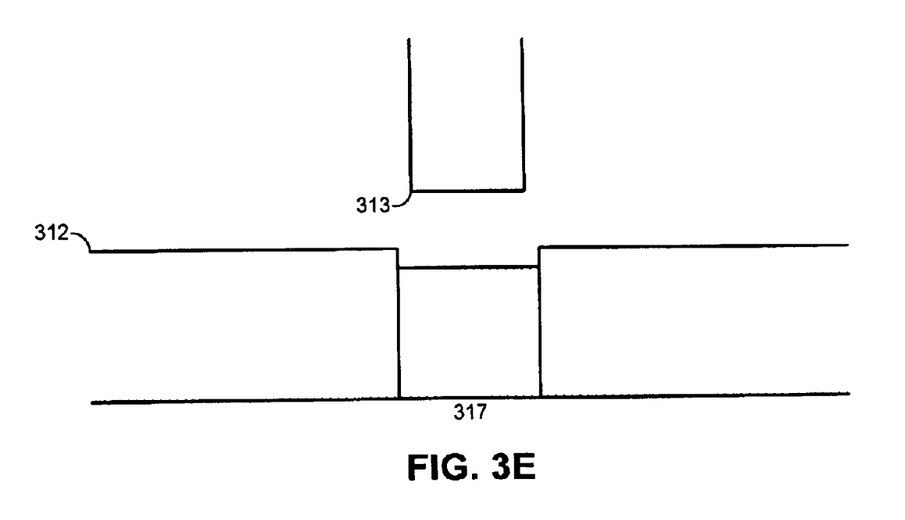
FIG. 3E illustrates how the number of figures can be further reduced.

Note that the corrected segments all have the same bias. Hence, the three segments 314–316 can be represented by a single figure 317 in the fractured mask data (as is illustrated in FIG. 3E). This reduces the number of figures that the mask writer has to produce and thereby reduces the mask writing time. Unfortunately, existing OPC systems do not consider mask writer properties and are consequently unable to make such an optimization.

Figure 3F:
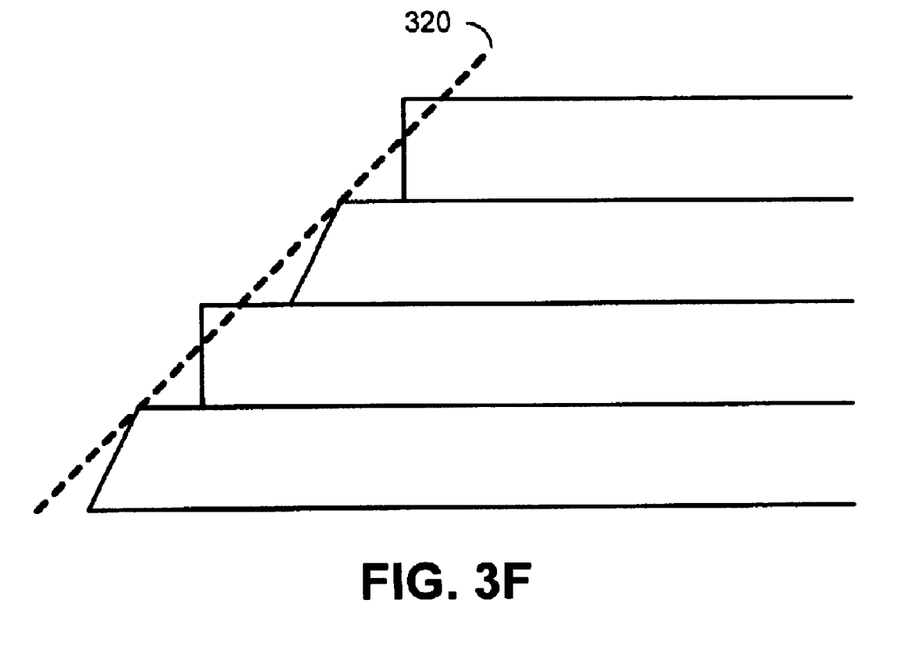
FIG. 3F illustrates an arbitrary angle and resulting mask writer approximations to generate the angle.

In some cases, optical proximity corrections and other features in the layout may be specified in terms of angles that cannot be produced by a mask writer. For example, a given mask writer may only be able to produce 45-degree and 90-degree angles. Such a mask writer has to approximate other angles (such as the angle represented by line 320) using 45-degree and 90-degree line edges as is illustrated in FIG. 3F. Note that this approximation may not be ideal for optical proximity correction purposes. Additionally, the file size may be increased significantly.

What is needed is a method an apparatus for performing optical proximity correction that accounts for mask writer properties.

SUMMARY

One embodiment of the invention provides a system that performs optical proximity correction in a manner that accounts for properties of a mask writer that generates a mask used in printing an integrated circuit. During operation, the system receives an input layout for the integrated circuit. The system also receives a set of mask writer properties that specify how the mask writer prints features. Next, the system performs an optical proximity correction process on the input layout to produce an output layout that includes a set of optical proximity corrections. This optical proximity correction process accounts for the set of mask writer properties in generating the set of optical proximity corrections, so that the mask writer can accurately produce the set of optical proximity corrections.

In a variation on this embodiment, the optical proximity correction process is an iterative process that performs a model-based simulation to adjust the set of optical proximity corrections. In doing so, the system determines whether a result from model-based simulation falls within a pre-defined error budget.

In a variation on this embodiment, the set of mask writer properties are used to constrain the set of optical proximity corrections during the optical proximity process, so that only optical proximity corrections that can be accurately generated by the mask writer are generated by the optical proximity correction process.

In a variation on this embodiment, the optical proximity process accounts for the set of mask writer properties in generating optical proximity corrections within only specific problematic areas of the input layout.

In a variation on this embodiment, receiving the set of mask writer properties involves allowing a user to specify a mask writer type through a user interface, and then retrieving the set of mask writer properties associated with the mask writer type. In this way, the user is able to select the mask writer type used during the optical proximity correction process.

In a further variation, allowing the user to specify the mask writer type involves allowing the user to select the mask writer type from a list of pre-specified mask writer types presented to the user through the user interface.

In a variation on this embodiment, the set of mask writer properties can specify: a placement accuracy that specifies how accurately the mask writer can place figures on the mask; a minimum rotated width for figures on the mask; an angle limitation that specifies the types of angles the mask writer is able to produce on the mask; grid size; and a figure limitation that specifies the types of figures the mask writer is able to produce on the mask.

In a variation on this embodiment, the iterative process performs a fracture-on-the-fly operation to break the output layout into figures suitable for printing by the mask writer, so that the model-based simulation operates on an accurate representation of what will appear on the mask.

DETAILED DESCRIPTION

Wafer Fabrication Process

Figure 4:
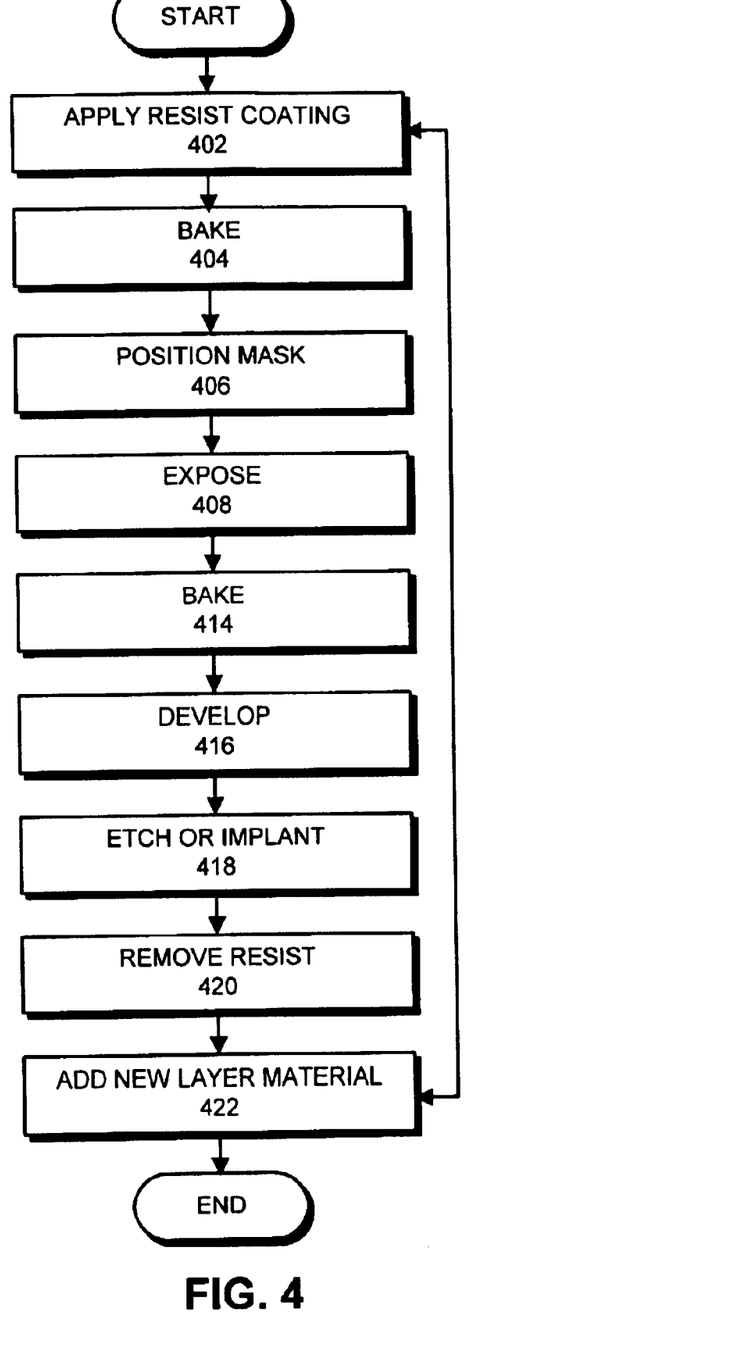
FIG. 4 is a flow chart illustrating the wafer fabrication process in accordance with an embodiment of the invention.

FIG. 4 is a flow chart illustrating the wafer fabrication process in accordance with an embodiment of the invention. The system starts by applying a photoresist layer to the top surface of a wafer (step 402). Next, the system bakes the photoresist layer (step 404). The system then positions a mask over the photoresist layer (step 406), and exposes the photoresist layer through the mask (step 408). Next, the system optionally bakes the wafer again (step 414) before developing the photoresist layer (step 416). Next, either a chemical etching or ion implantation step takes place (step 418) before the photoresist layer is removed (step 420). (Note that in the case of a lift-off process, a deposition can take place.) Finally, a new layer of material can be added and the process can be repeated for the new layer (step 422).

Design Process

Figure 5:
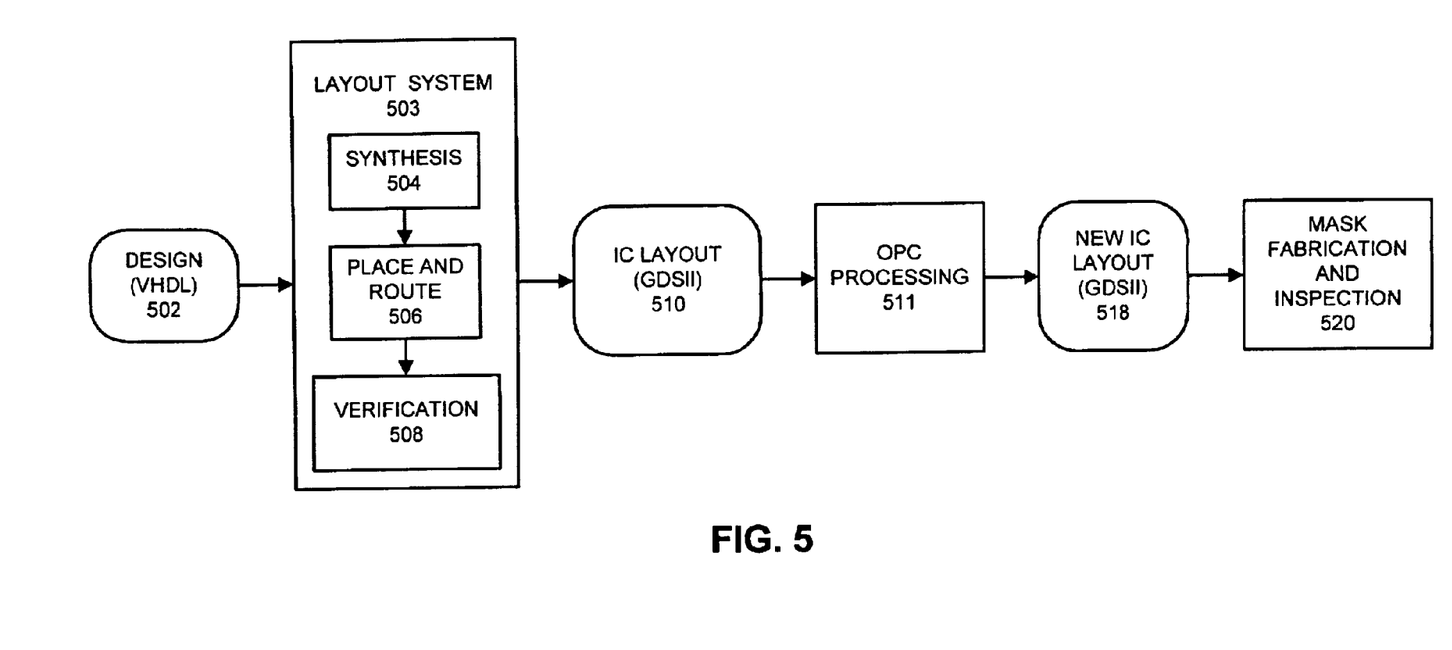
FIG. 5 illustrates the process of creating a mask to be used in fabricating an integrated circuit in accordance with an embodiment of the invention.

FIG. 5 illustrates the process of creating a mask to be used in the wafer fabrication process described above in accordance with an embodiment of the invention. The process starts when a circuit designer produces a design 502 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Design 502 then feeds through a layout system 503 that performs a number of functions, such as synthesis 504, placement and routing 506 and verification 508. The result is an integrated circuit (IC) layout 510, which can be in the form of a hierarchical specification expressed in a format such as GDSII.

IC layout 510 then passes into OPC processing system 511, which performs optical proximity corrections to compensate for optical effects that arise during the photolithography process. For example, OPC software tools from Numerical Technologies, Inc., San Jose, Calif., could be used at step 511 such as iN-Tandem™. Additionally, not shown, phase shift processing can be performed prior to OPC, e.g. using the iN-Phase™ tool from Numerical Technologies, Inc.

The output of OPC processing system 511 is a new IC layout 518. New IC layout 518 subsequently passes into mask fabrication and inspection processes 520.

OPC Processing System

Figure 6:
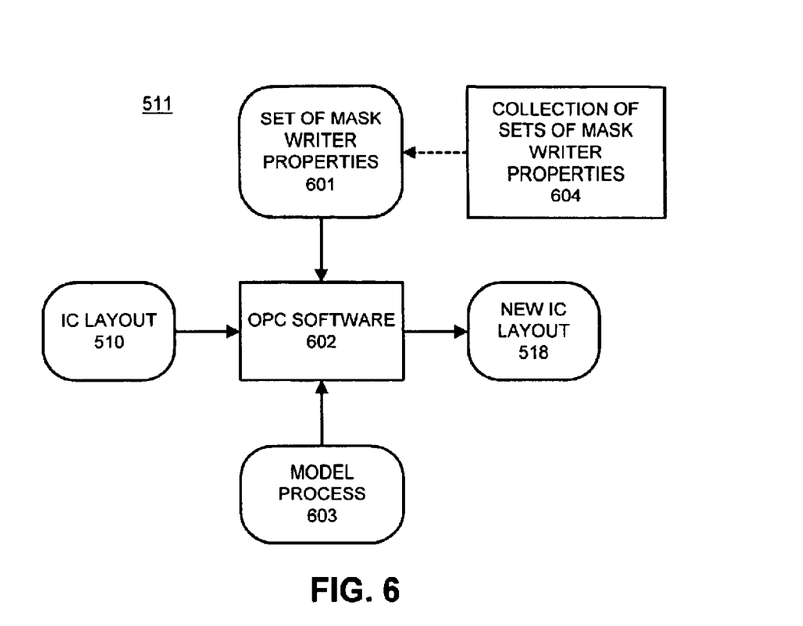
FIG. 6 illustrates the OPC process in accordance with an embodiment of the invention.

FIG. 6 illustrates OPC processing system 511 in accordance with an embodiment of the invention. OPC processing system 511 contains OPC software 602, which converts IC layout 510 into a new IC layout 518, which includes optical proximity corrections. It is the goal of OPC that the new IC layout 518 more accurately print the intended design (e.g. the IC layout 510) on the wafer.

During this process, OPC software 602 make use of a process model 603 that specifies how optical effects (and possibly other effects) during a manufacturing process will influence printing of IC layout 510. The process model 603 may be generated using tools such as ModelGen and ModelCal from Numerical Technologies, Inc.

OPC software 602 also receives a set of mask writer properties 601, which specify how a specific type of mask writer will approximate features in the layout (including the optical proximity corrections) while generating a mask for the layout.

Note that the system can select the set of mask writer properties 601 from a collection of sets of mask writer properties 604 maintained by the system for different types of mask writers. Moreover, writer properties 604 can originate from a "library" or collection of mask writer properties that accompany the software in some form or another.

Mask Fabrication and Inspection Process

Figure 7:
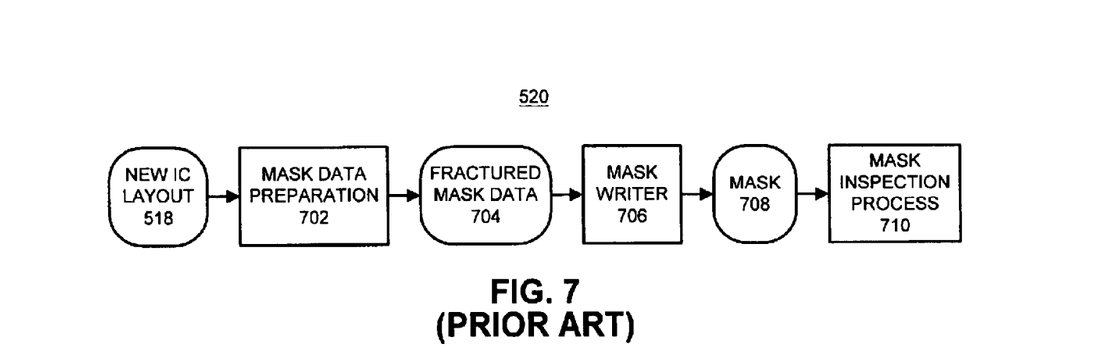
FIG. 7 illustrates the mask fabrication and inspection process.

FIG. 7 illustrates the mask fabrication and inspection process 520 from FIG. 5. This process initially receives new IC layout 518. New IC layout 518 is subsequently processed by mask data preparation software 702 to produce a fractured mask data 704 that includes figures suitable for writing by mask writer 706. In some embodiments, the CATS™ software from Numerical Technologies, Inc. is used at step 702. Mask writer 706 then writes the figures specified in fractured mask data 704 onto the physical mask 708. The physical mask 708 can then be subjected to a mask inspection process 710 to verify that physical mask 708 was properly fabricated.

Process of Selecting Mask Writer Type

Figure 8:
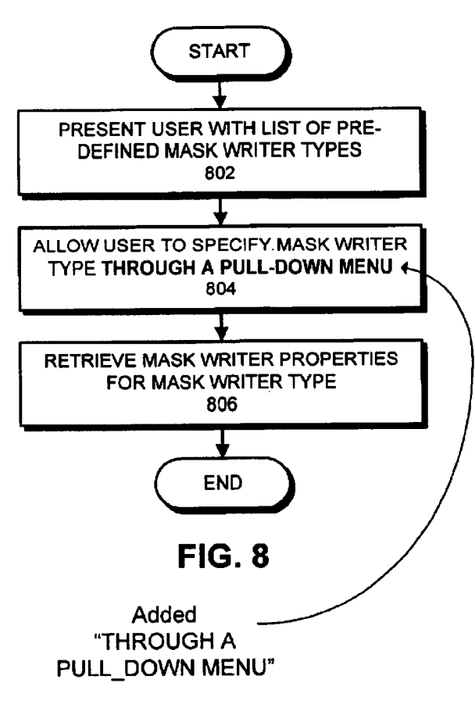
FIG. 8 presents a flow chart illustrating the process of selecting a mask writer type in accordance with an embodiment of the invention.

FIG. 8 presents a flow chart illustrating the process of selecting a mask writer type in accordance with an embodiment of the invention. The system first presents the user with a list of pre-defined mask writer types (step 802). For example, the list can be presented as options in a pull-down menu of a graphical user interface. Next, the system allows the user to specify a mask writer type (step 804), for example, by allowing the user to select an item from a pull-down menu. Next, the system retrieves the a set of mask writer properties 601 associated with the specified mask writer type from the collection of sets of mask writer types 604 maintained by the system (step 806).

Process of Performing Optical Proximity Correction

Figure 9:
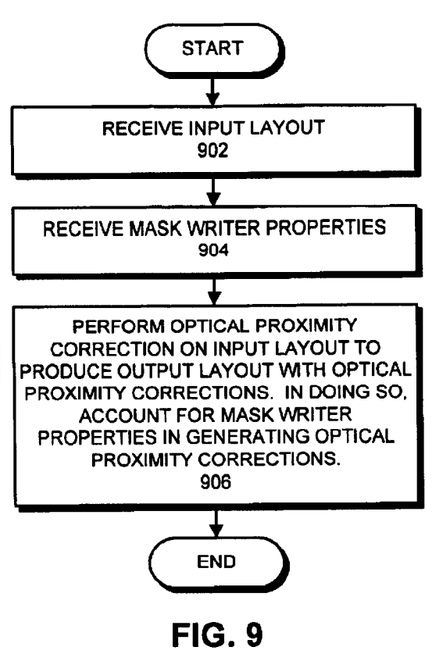
FIG. 9 presents a flow chart illustrating the optical proximity correction process in accordance with an embodiment of the invention.

FIG. 9 presents a flow chart illustrating the optical proximity correction process in accordance with an embodiment of the invention for use at step 511 by OPC software 602. The system initially receives an input layout (step 902), such as IC layout 510 illustrated in FIG. 6. The system also receives a set of mask writer properties (step 904), such as the set of mask writer properties 601 illustrated in FIG. 6. The system uses these inputs to perform optical proximity correction on input IC layout 510 to produce as output a new IC layout 518 that includes optical proximity corrections (step 906). During this process, the system accounts for mask writer properties in generating the optical proximity corrections, so that the mask writer can accurately produce optical proximity corrections. These mask writer properties can include: a placement accuracy that specifies how accurately the mask writer can place figures on the mask; grid size, which specifies the minimum increment of figure size; a minimum rotated width for figures on the mask, which specifies the smallest width obtained while rotating a given figure while rotating a figure through 360 degrees; an angle limitation that specifies the types of angles the mask writer is able to produce on the mask; and a figure limitation that specifies the types of figures the mask writer is able to produce on the mask.

Performing Fracturing On-the-Fly

Figure 10:
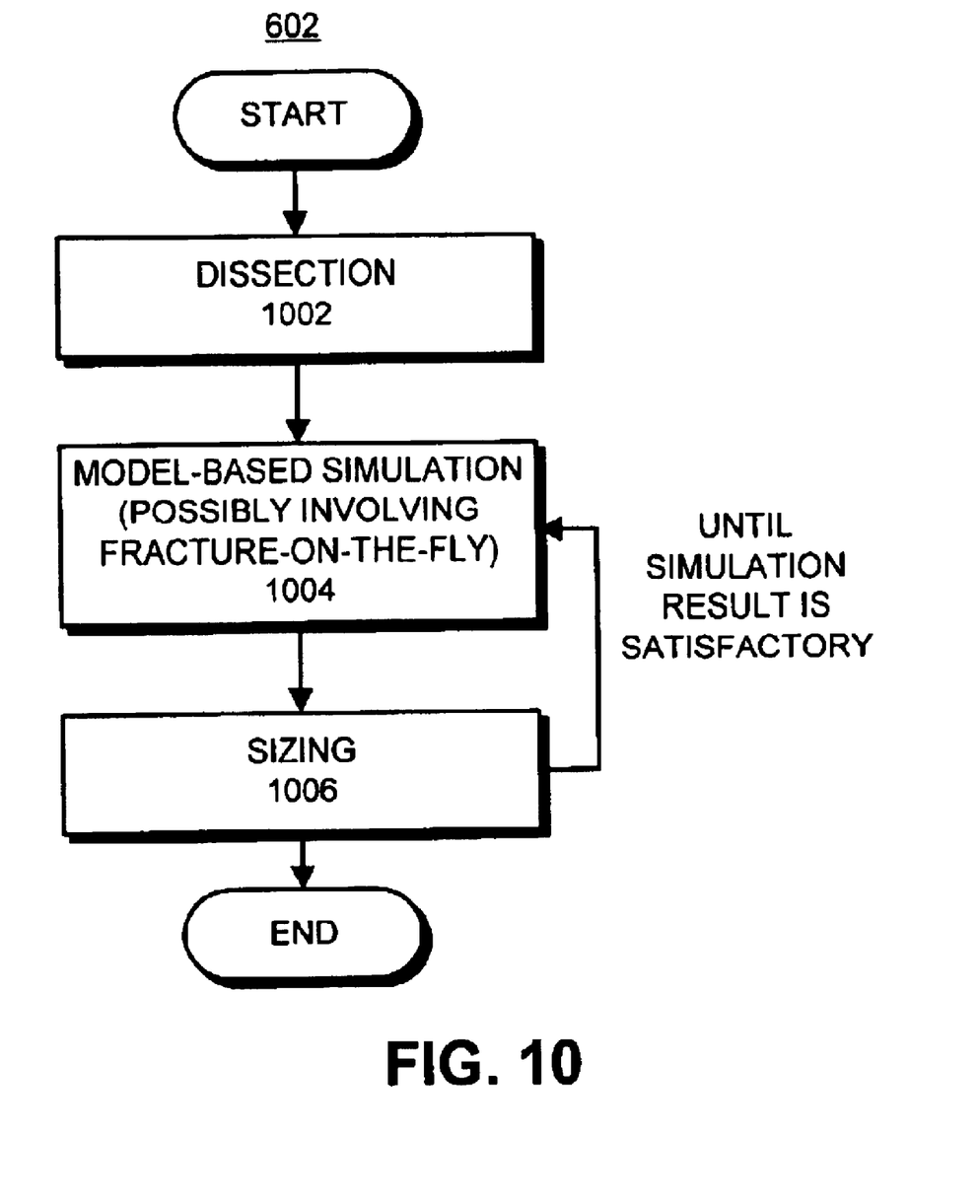
FIG. 10 presents a flow chart illustrating a fracture on-the-fly operation during a model-based OPC process in accordance with an embodiment of the invention.

FIG. 10 presents a flow chart illustrating a model-based OPC process in accordance with an embodiment of the invention. The system starts by performing a dissection operation (step 1002) to dissect edges in the layout into segments.

The system then performs a model-based simulation on the layout to determine how optical effects and manufacturing processes are likely to affect the layout (step 1004). The system subsequently uses results of this simulation to perform a bias that adjusts segments in the layout to compensate for the errors indicated by the model-based simulation (step 1006). The system iteratively repeats steps 1004 and 1006 until the resulting layout meets a desired specification (or fails to meet the specification).

Note that step 1004 optionally involves performing a fracture-on-the fly operation to break up the layout (or local regions of the layout) into figures that the mask writer can write. In this way, the system takes into account the fracturing that takes place for mask writing purposes during the model-based OPC process. As a result, this process produces optical proximity corrections that are likely to be accurately generated during the mask writing process.

Note that in general the fracturing can be performed at a number of different times. It can be performed prior to OPC, on-the-fly during OPC, or used as a reference during OPC.

EXAMPLES

Figure 11:
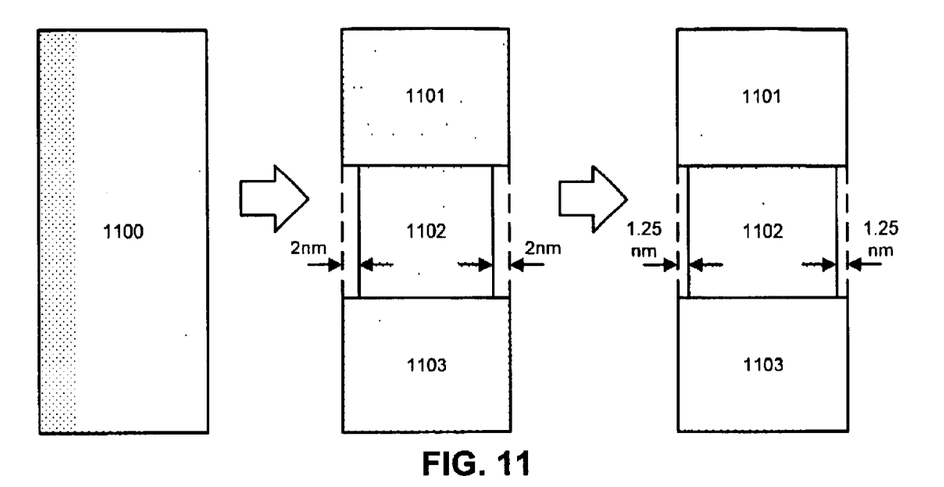
FIG. 11 illustrates how an exemplary optical proximity correction is affected by mask writer limitations in accordance with an embodiment of the invention.

FIG. 11 illustrates how an exemplary optical proximity correction is affected by mask writer limitations in accordance with an embodiment of the invention. In this example, a shape 1100 is segmented by the OPC process to form three areas 1101–1103. Note that the OPC process causes figure 1102 to be corrected by biasing the segments in area 1102 in by 2 nm. However, if the minimum grid size that can be produced by the mask writer is 1.25 nm, the 2.0 nm correction will have to be approximated to either 1.25 nm or 2.5 nm by the mask data preparation software in step 520. This is an important point because the mask data preparation software used in step 520 will not perform additional optical proximity corrections, but rather will use its own internal rounding and grid snapping algorithms to position the line segments. The mask data preparation software may also create complex patterns to approximate the intended 2 nm line width (see, e.g., FIG. 3 generally for an example of how an angled line might get fractured by mask data preparation software of the type shown in FIG. 7).

In the example illustrated in FIG. 11, the OPC process specified in FIG. 10 analyzes the set of mask writer properties 601 and determines that the mask writer properties limit possible biases to fall on a grid with increments of 1.25 nm. The OPC process then chooses to use a 1.25 nm correction that falls on a grid line. This 1.25 nm correction will not have to be subsequently changed during mask data preparation (step 520) for mask writing purposes.

Note that allowing OPC software 602 to select between corrections that fall on mask writer grid lines can result in a more optimal correction than simply allowing the downstream mask data preparation software to arbitrarily make the decision, without considering how the OPC process will be affected by the choice of correction.

Figure 12:
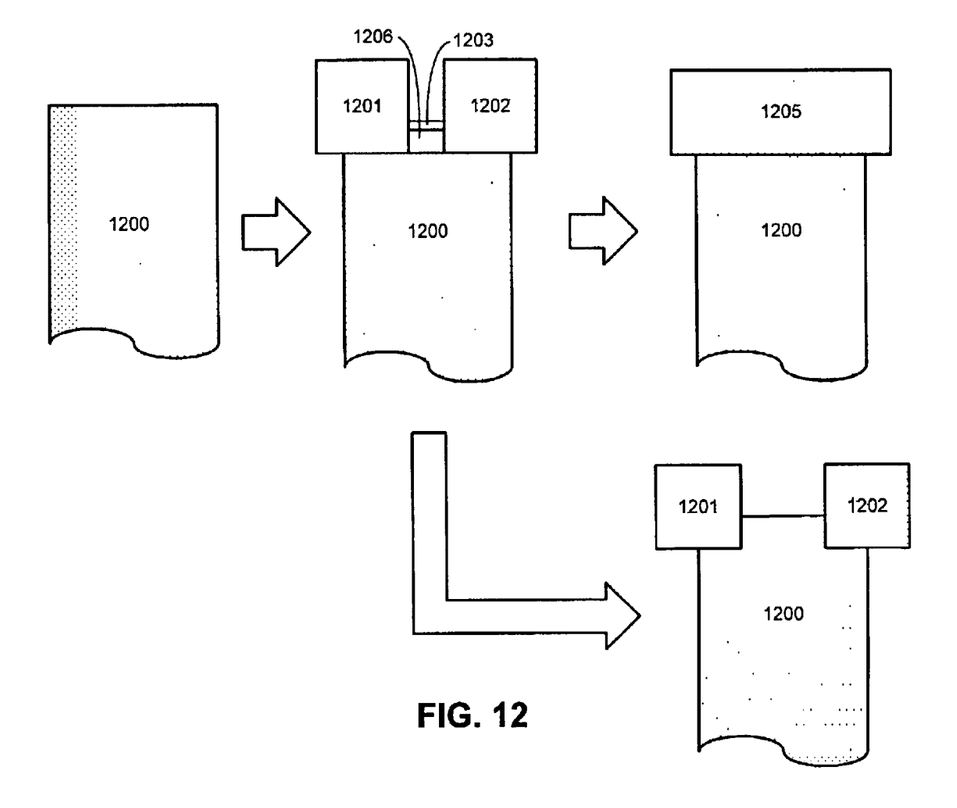
FIG. 12 illustrates another example of how an optical proximity correction is affected by mask writer limitations in accordance with an embodiment of the invention.

FIG. 12 illustrates another example of how an optical proximity correction is affected by mask writer limitations in accordance with an embodiment of the invention. In FIG. 12, a line end 1200 is modified by biasing the corner segments to create areas 1201 and 1202 to correct for corner rounding, and by biasing the center line segment outward to create area 1203 to correct for line end shortening. Unfortunately, during fracturing area 1203 and the adjacent area 1206 of the feature will result in a tiny figure (or sliver) that falls below the minimum rotated width for the target mask writer 706. Accordingly, during mask data preparation 702, the prior art tool may produce slivers that are poorly exposed, or not exposed at all, during mask writing.

Given this mask writer limitation, it may be preferable to use a single larger rectangular area 1205 to correct for line end shortening and corner rounding simultaneously, or to use a wider separation between the areas 1201 and 1202 and forego biasing the segment that produces area 1203, to perform the correction in a manner that is consistent with mask writer limitations.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method for performing an optical proximity correction (OPC) process on a layout for an integrated circuit (IC) using a selected mask writer description, wherein the layout is comprised of a plurality of features, the method comprising:

specifying the selected mask writer description so that the OPC process uses the selected mask writer description to control the parameters of the OPC process, wherein the selected mask writer description specifies:
a mask writer type;
a placement accuracy that specifies the accuracy that the mask writer uses to place figures on the mask,
a minimum rotated width for figures on the mask;
an angle limitation that specifies the types of angles the mask writer will produce on the mask, and
a figure limitation that specifies the types of figures the mask writer will produce on the mask;

segmenting the plurality of features in the layout into a plurality of segments using the selected mask writer description;

simulating environment for each segment in the plurality of segments using the selected mask writer description;

adjusting segments in the plurality of segments responsive to the simulating and using the selected mask writer description; and repeating the segmenting, simulating and adjusting until a termination condition is satisfied.

2. The method of claim 1, further comprising allowing a user to pick the selected mask writer description from a pull-down menu containing mask writer types for a plurality of mask writer descriptions.

3. The method of claim 1, further comprising performing a fracture-on-the-fly operation prior to simulation to break the output layout into figures suitable for printing by a mask writer, so that the simulation operates on an accurate representation of what will appear on the mask.

4. The method of claim 1, wherein the selected mask writer description is used to constrain optical proximity corrections during the optical proximity correction process, so that only optical proximity corrections that will be accurately generated by a mask writer are generated by the optical proximity correction process.

5. The method of claim 1, wherein the termination condition is satisfied when a result from the simulation falls within a pre-defined error budget.

6. The method of claim 1, wherein the optical proximity correction process accounts for the selected mask writer description in generating optical proximity corrections to account for the properties of a selected mask writer.

7. A computer-readable storage medium storing instructions that when executed by a computer cause the computer to perform a method for performing an optical proximity correction (OPC) process on a layout for an integrated circuit (IC) using a selected mask writer description, wherein the layout is comprised of a plurality of features, the method comprising:

specifying the selected mask writer description so that the OPC process uses the selected mask writer description to control the parameters of the OPC process, wherein the selected mask writer description specifies:
a mask writer type,
a placement accuracy that specifies the accuracy that the mask writer uses to place figures on the mask,
a minimum rotated width for figures on the mask;
an angle limitation that specifies the types of angles the mask writer will produce on the mask, and a figure limitation that specifies the types of figures the mask writer will produce on the mask;

segmenting the plurality of features in the layout into a plurality of segments using the selected mask writer description;

simulating environment for each segment in the plurality of segments using the selected mask writer description;

adjusting segments in the plurality of segments responsive to the simulating and using the selected mask writer description; and repeating the segmenting, simulating and adjusting until a termination condition is satisfied.

8. The computer-readable storage medium of claim 7, wherein the method further comprises allowing a user to pick the selected mask writer description from a pull-down menu containing mask writer types for a plurality of mask writer descriptions.

9. The computer-readable storage medium of claim 7, wherein the method further comprises performing a fracture-on-the-fly operation prior to simulation to break the output layout into figures suitable for printing by a mask writer, so that the simulation operates on an accurate representation of what will appear on the mask.

10. The computer-readable storage medium of claim 7, wherein the selected mask writer description is used to constrain optical proximity corrections during the optical proximity correction process, so that only optical proximity corrections that will be accurately generated by a mask writer are generated by the optical proximity correction process.

11. The computer-readable storage medium of claim 7, wherein the termination condition is satisfied when a result from the simulation falls within a pre-defined error budget.

12. The computer-readable storage medium of claim 7, wherein the optical proximity correction process accounts for the selected mask writer description in generating optical proximity corrections to account for the properties of a selected mask writer.

13. An apparatus that performs an optical proximity correction (OPC) process on a layout for an integrated circuit (IC) using a selected mask writer description, wherein the layout is comprised of a plurality of features, the apparatus comprising:

specifying the selected mask writer description so that the OPC process uses the selected mask writer description to control the parameters of the OPC process, wherein the selected mask writer description specifies:
a mask writer type,
a placement accuracy that specifies the accuracy that the mask writer uses to place figures on the mask,
a minimum rotated width for figures on the mask;
an angle limitation that specifies the types of angles the mask writer will produce on the mask, and
a figure limitation that specifies the types of figures the mask writer will produce on the mask;

a segmenting mechanism configured to segment the plurality of features in the layout into a plurality of segments using the selected mask writer description;

a simulating mechanism configured to simulate environment for each segment in the plurality of segments using the selected mask writer description;

a correcting mechanism configured to adjust segments in the plurality of segments responsive to the simulating and using the selected mask writer description; and wherein the apparatus is configured to iteratively apply the segmenting mechanism, the simulating mechanism and the correcting mechanism until a termination condition is satisfied.

14. The apparatus of claim 13, further comprising a selecting mechanism configured to allow a user to pick the selected mask writer description from a pull-down menu containing mask writer types for a plurality of mask writer descriptions.

15. The apparatus of claim 13, further comprising a fracture-on-the-fly mechanism configured to break the output layout into figures suitable for printing by a mask writer, so that the simulation mechanism operates on an accurate representation of what will appear on the mask.

16. The apparatus of claim 13, wherein the selected mask writer description is used to constrain optical proximity corrections during the optical proximity correction process, so that only optical proximity corrections that will be accurately generated by a mask writer are generated by the optical proximity correction process.

17. The apparatus of claim 13, wherein the termination condition is satisfied when a result from the simulation falls within a pre-defined error budget.

18. The apparatus of claim 13, wherein the correcting mechanism accounts for the selected mask writer description in generating optical proximity corrections to account for the properties of a selected mask writer.

19. A mask to be used in an optical lithography process for manufacturing an integrated circuit, wherein the mask is created through a method for performing an optical proximity correction (OPC) process on a layout for an integrated circuit (IC) using a selected mask writer description, wherein the layout is comprised of a plurality of features, the method comprising:

specifying the selected mask writer description so that the OPC process uses the selected mask writer description to control the parameters of the OPC process, wherein the selected mask writer description specifies:
a mask writer type;
a placement accuracy that specifies the accuracy that the mask writer uses to place figures on the mask,
a minimum rotated width for figures on the mask;
an angle limitation that specifies the types of angles the mask writer will produce on the mask, and
a figure limitation that specifies the types of figures the mask writer will produce on the mask;

segmenting the plurality of features in the layout into a plurality of segments using the selected mask writer description;

simulating environment for each segment in the plurality of segments using the selected mask writer description;

adjusting segments in the plurality of segments responsive to the simulating and using the selected mask writer description; and repeating the segmenting, simulating and adjusting until a termination condition is satisfied.

20. An integrated circuit created through a process that performs an optical proximity correction (OPC) process on a layout for an integrated circuit (IC) using a selected mask writer description, wherein the layout is comprised of a plurality of features, the process comprising:

specifying the selected mask writer description so that the OPC process uses the selected mask writer description to control the parameters of the OPC process, wherein the selected mask writer description specifies:
a mask writer type, a placement accuracy that specifies the accuracy that the mask writer uses to place figures on the mask, a minimum rotated width for figures on the mask;

an angle limitation that specifies the types of angles the mask writer will produce on the mask, and a figure limitation that specifies the types of figures the mask writer will produce on the mask;

segmenting the plurality of features in the layout into a plurality of segments using the selected mask writer description;

simulating environment for each segment in the plurality of segments using the selected mask writer description;

adjusting segments in the plurality of segments responsive to the simulating and using the selected mask writer description; and repeating the segmenting, simulating and adjusting until a termination condition is satisfied.

* * * * *